US012672461B2

(12) United States Patent
Han et al.

(10) Patent No.: US 12,672,461 B2
(45) Date of Patent: Jun. 30, 2026

(54) DISPLAY DEVICE

(71) Applicant: Samsung Display Co., LTD., Yongin-si (KR)

(72) Inventors: Eunhee Han, Yongin-si (KR); Cheol Jang, Yongin-si (KR); Youngje Cho, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 323 days.

(21) Appl. No.: 18/238,470

(22) Filed: Aug. 26, 2023

(65) Prior Publication Data

US 2024/0237474 A1     Jul. 11, 2024

(30) Foreign Application Priority Data

Jan. 11, 2023     (KR) ........................ 10-2023-0004312

(51) Int. Cl.
| | |
|---|---|
| *H10K 59/50* | (2023.01) |
| *G02B 26/00* | (2006.01) |
| *H10K 59/12* | (2023.01) |
| *H10K 59/122* | (2023.01) |
| *H10K 59/35* | (2023.01) |
| *H10K 59/80* | (2023.01) |

(52) U.S. Cl.
CPC ........... *H10K 59/50* (2023.02); *G02B 26/001* (2013.01); *H10K 59/122* (2023.02); *H10K 59/35* (2023.02)

(58) Field of Classification Search
CPC .... H10K 59/122; H10K 59/878; H10K 59/50; H10K 59/872; G02B 26/001
See application file for complete search history.

(56) References Cited

U.S. PATENT DOCUMENTS

| | | | | |
|---|---|---|---|---|
| 2011/0249214 | A1* | 10/2011 | Cheong ................. | G02B 6/002 |
| | | | | 349/61 |
| 2015/0097951 | A1* | 4/2015 | Barrows ................ | H04N 25/76 |
| | | | | 901/1 |
| 2020/0343310 | A1* | 10/2020 | Bae ...................... | H10K 59/352 |
| 2021/0013455 | A1 | 1/2021 | Bae et al. | |
| 2022/0171249 | A1 | 6/2022 | Bregulla et al. | |
| 2024/0107861 | A1* | 3/2024 | Yamazaki .............. | H10K 50/11 |

OTHER PUBLICATIONS

Extended European Search Report mailed May 23, 2024 in EP Application No. 23213117.7, 8 pages.

* cited by examiner

*Primary Examiner* — Antonio B Crite
(74) *Attorney, Agent, or Firm* — CANTOR COLBURN LLP

(57) ABSTRACT

A display device includes a substrate, a light-emitting element disposed on the substrate, a capping layer disposed on the light-emitting element, and a light control pattern disposed on the capping layer, including an inclined outer side surface and defining an air layer having a thickness which is variable.

19 Claims, 8 Drawing Sheets

F I G. 3
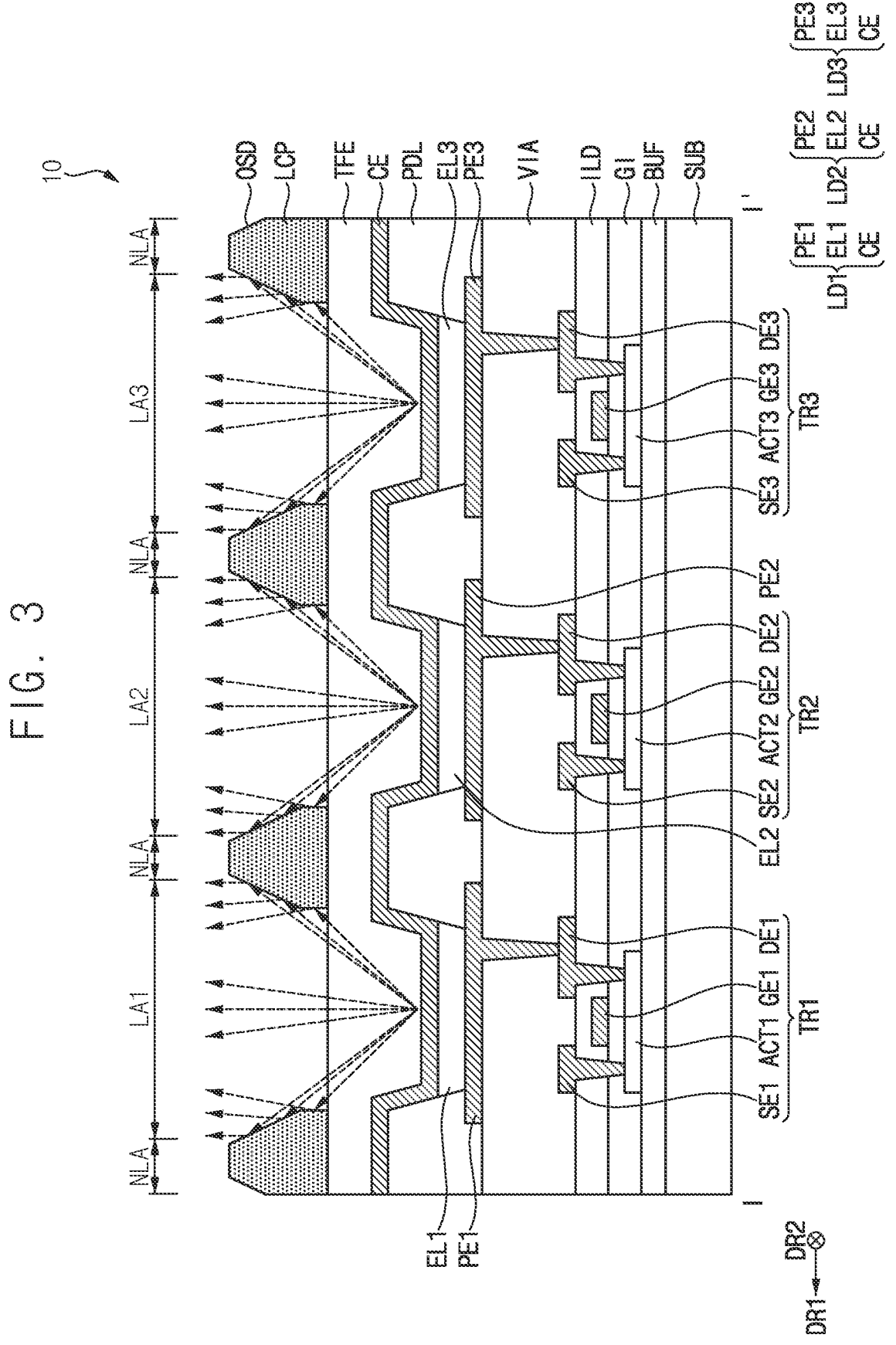

F I G. 6
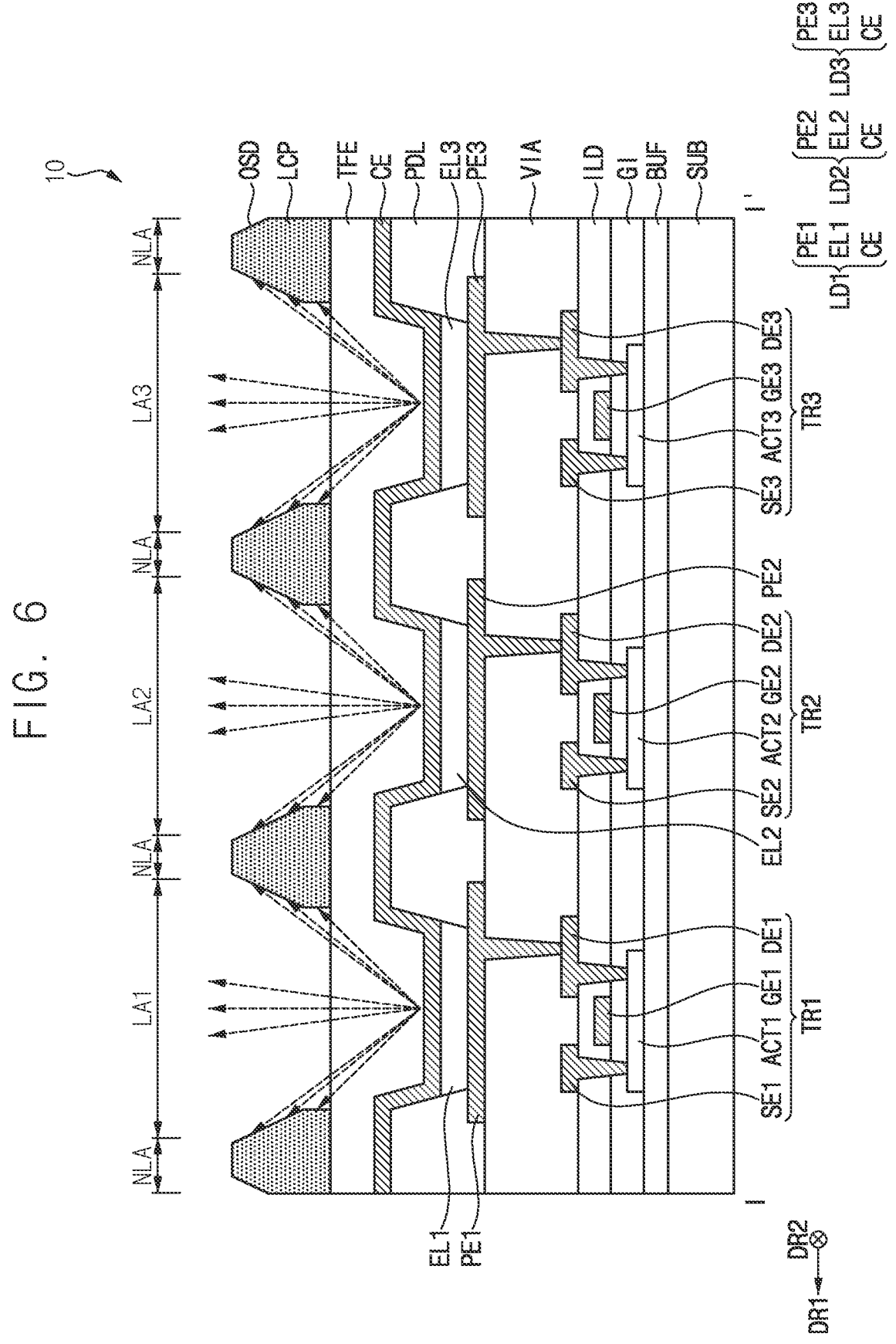

DISPLAY DEVICE

This application claims priority to Korean Patent Application No. 10-2023-0004312, filed on Jan. 11, 2023, and all the benefits accruing therefrom under 35 U.S.C. § 119, the content of which in its entirety is herein incorporated by reference.

BACKGROUND

1. Field

Embodiments relate to a display device. More specifically, embodiments relate to a display device that provides visual information.

2. Description of the Related Art

As information technology develops, an importance of display devices, which are communication media between users and information, is being highlighted. Accordingly, display devices such as liquid crystal display devices, organic light-emitting display devices, plasma display devices, or the like are widely used in various fields.

The display device may display an image having a wide viewing angle, or a viewing angle of the image displayed on the display device may be limited when desired to improve security or image reflection.

SUMMARY

Embodiments provide a display device capable of adjusting a viewing angle.

A display device in an embodiment of the disclosure includes a substrate, a light-emitting element disposed on the substrate, a capping layer disposed on the light-emitting element, and a light control pattern disposed on the capping layer, including an inclined outer side surface and defining an air layer having a thickness which is variable.

In an embodiment, the light control pattern may include an inclined structure including an inclined side surface, an electrode pattern disposed on the side surface of the inclined structure, a reflective layer disposed on the electrode pattern, and a semi-transmissive layer disposed on the reflective layer and having a position which is variable.

In an embodiment, the reflective layer may contact at least a portion of the electrode pattern.

In an embodiment, the air layer may be defined between the reflective layer and the semi-transmissive layer.

In an embodiment, the thickness of the air layer may vary according to a voltage applied to the electrode pattern.

In an embodiment, the thickness of the air layer may vary according to the position of the semi-transmissive layer.

In an embodiment, the light control pattern may further include an insulating layer disposed between the inclined structure and the reflective layer and covering at least a portion of the electrode pattern.

In an embodiment, the light control pattern may further include a support pattern disposed between the capping layer and the semi-transmissive layer and supporting the semi-transmissive layer.

In an embodiment, the semi-transmissive layer may cover the inclined structure.

In an embodiment, the display device may further include a pixel defining layer disposed on the substrate. The pixel defining layer may define an opening overlapping the light-emitting element.

In an embodiment, the light control pattern may overlap the pixel defining layer.

In an embodiment, the light control pattern may be switched between a wide viewing angle mode and a narrow viewing angle mode.

In an embodiment, in the wide viewing angle mode, the electrode pattern may be applied with a first voltage and the air layer may have a first thickness, and in the narrow viewing angle mode, the electrode pattern may be applied with a second voltage and the air layer may have a second thickness different from the first thickness.

In an embodiment, the first thickness may be greater than the second thickness.

In an embodiment, in the wide viewing angle mode, the light control pattern may constructively interfere with at least a portion of visible light emitted by the light-emitting element.

In an embodiment, in the narrow viewing angle mode, the light control pattern may destructively interfere with at least a portion of visible light emitted by the light-emitting element.

In an embodiment, in the narrow viewing angle mode, the light control pattern may constructively interfere with at least a portion of ultraviolet light emitted by the light-emitting element.

In an embodiment, the display device may further include an encapsulation substrate disposed on the light control pattern.

In an embodiment, the encapsulation substrate may include glass.

In an embodiment, the display device may further include a sealing member disposed between the substrate and the encapsulation substrate.

In a display device in embodiments of the disclosure, the display device may include a light control pattern including an electrode pattern, a reflective layer and a semi-transmissive layer. The reflective layer and the semi-transmissive layer may define an air layer. By adjusting a thickness of the air layer according to a voltage applied to the electrode pattern, the light control pattern may constructively interfere with visible light in a wide viewing angle mode, and may destructively interfere with the visible light in a narrow viewing angle mode. Accordingly, in the narrow viewing angle mode, only visible light having a viewing angle greater than or equal to a predetermined angle among the visible light emitted from the light-emitting element is offset, so that luminance of the display device may not degraded. In addition, since the light control pattern has bistability, loss of power consumption may be reduced. In addition, since a separate film process may not be desired, efficiency of a manufacturing process of the display device may be improved.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which:

FIG. 3 is a cross-sectional view taken along line I-I' of FIG. 2.

FIG. 6 is a cross-sectional view illustrating another embodiment of FIG. 3.

DETAILED DESCRIPTION

Figure 1:
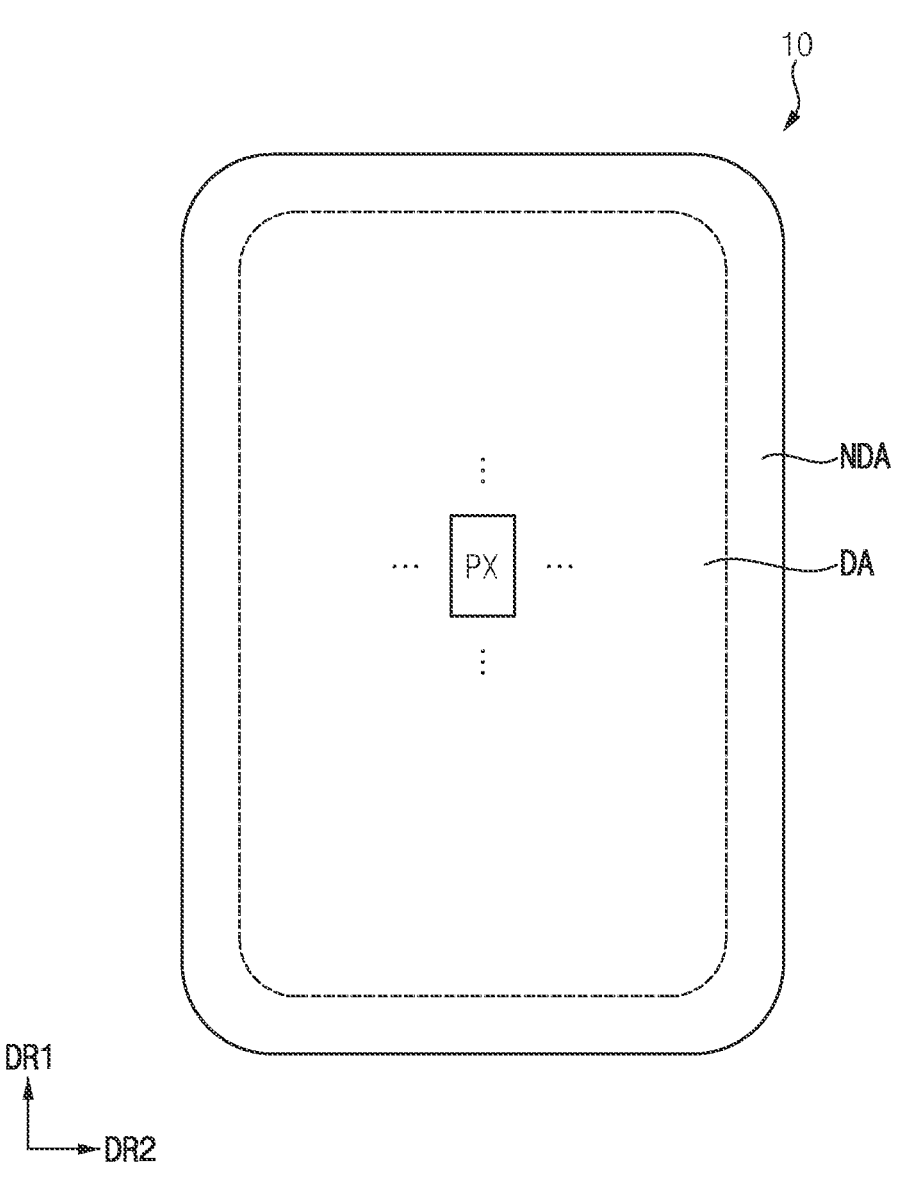
FIG. 1 is a plan view illustrating an embodiment of a display device according to the disclosure.

Hereinafter, embodiments of the disclosure will be described in more detail with reference to the accompanying drawings. The same reference numerals are used for the same components in the drawings, and redundant descriptions of the same components will be omitted.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term such as "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FIG. 1 is a plan view illustrating an embodiment of a display device according to the disclosure.

Referring to FIG. 1, a display device 10 in an embodiment may include a display area DA and a non-display area NDA.

The display area DA may be an area that displays an image. A planar shape of the display area DA may be a quadrangular shape, e.g., rectangular shape, with rounded corners. However, the planar shape of the display area DA is not limited thereto, and the display area DA may have various planar shapes such as a circular shape, an elliptical shape, a polygonal shape, or the like.

In the display area DA, a plurality of pixels PX may be repeatedly arranged along a first direction DR1 and a second direction DR2 intersecting the first direction DR1 in a plan view. In an embodiment, the second direction DR2 may be perpendicular to the first direction DR1, for example. Each of the pixels PX may be defined as a minimum light-emitting unit capable of displaying light. Each of the pixels PX may include a light-emitting element and a pixel circuit for driving the light-emitting element. In an embodiment, the light-emitting element may include an organic light-emitting diode, and the pixel circuit may include at least one thin film transistor.

The non-display area NDA may be an area not displaying an image. The non-display area NDA may be disposed around the display area DA. In an embodiment, the non-display area NDA may surround an entirety of the display area DA, for example. In an embodiment, drivers for displaying an image of the display area DA may be disposed in the non-display area NDA.

Figure 2:
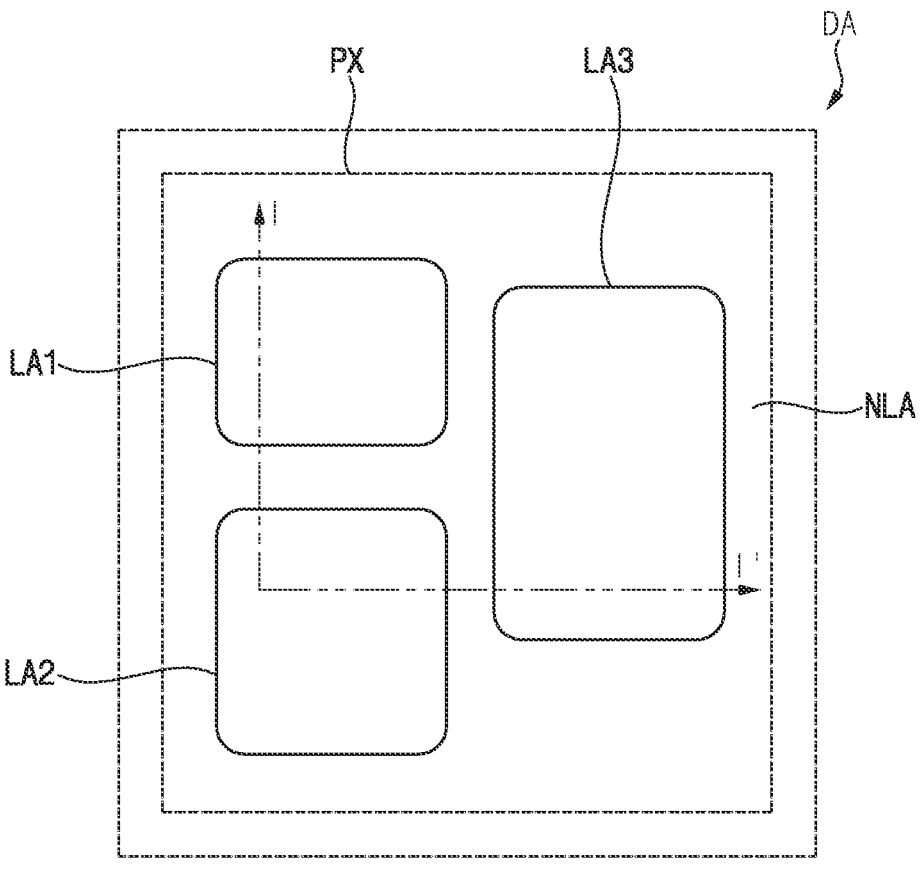
FIG. 2 is an enlarged plan view of a part of a display area of the display device of FIG. 1.

FIG. 2 is an enlarged plan view of a part of a display area of the display device of FIG. 1.

Referring to FIGS. 1 and 2, the display device 10 may include the display area DA and the non-display area NDA, and the pixels PX may be disposed in the display area DA.

Each of the pixels PX may include a first light-emitting area LA1, a second light-emitting area LA2, a third light-emitting area LA3 and a non-light-emitting area NLA.

Each of the first light-emitting area LA1, the second light-emitting area LA2 and the third light-emitting area LA3 may emit light. In an embodiment, the first light-emitting area LA1 may emit light of a first color, the second light-emitting area LA2 may emit light of a second color, and the third light-emitting area LA3 may emit light of a third color. In an embodiment, the first color may be red, the second color may be green, and the third color may be blue, for example, but the disclosure is not limited thereto. As the light of the first color, the light of the second color and the light of the third color are combined, each of the pixels PX may emit light of various colors. The non-light-emitting area NLA may not emit light.

Figure 4:
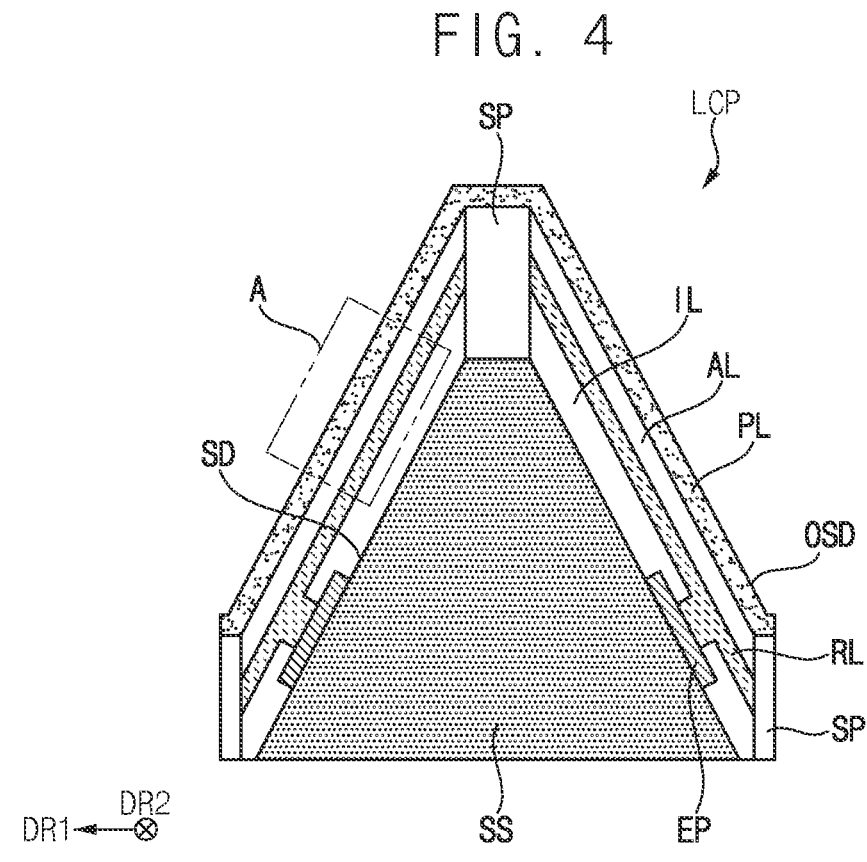
FIG. 4 is an enlarged cross-sectional view of a light control pattern of FIG. 3.
Figure 5:
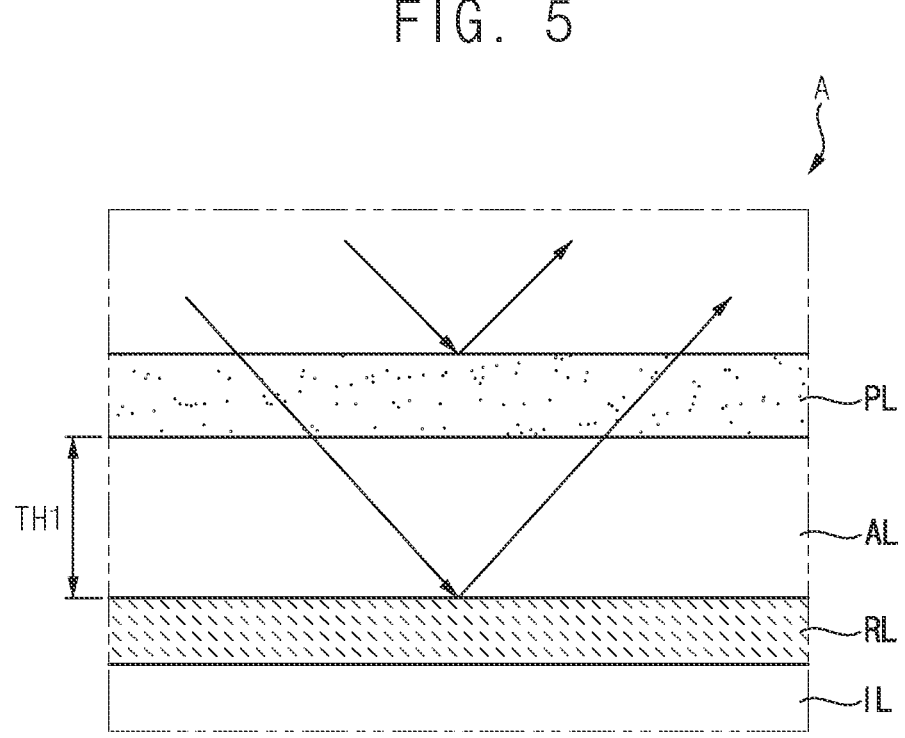
FIG. 5 is an enlarged cross-sectional view of area A of FIG. 4.

FIG. 3 is a cross-sectional view taken along line I-I' of FIG. 2. FIG. 4 is an enlarged cross-sectional view of a light control pattern of FIG. 3. FIG. 5 is an enlarged cross-sectional view of area A of FIG. 4. In an embodiment, FIGS. 3, 4 and 5 may be cross-sectional views illustrating a wide viewing angle mode of a light control pattern LCP, and FIG. 5 may be an enlarged cross-sectional view of an air layer AL defined by the light control pattern LCP, for example.

Referring to FIGS. 3, 4 and 5, the display device 10 may include a substrate SUB, a buffer layer BUF, a first transistor TR1, a second transistor TR2, a third transistor TR3, a gate insulating layer GI, an inter-insulating layer ILD, a via-insulating layer VIA, a pixel defining layer PDL, a first light-emitting element LD1, a second light-emitting element LD2, a third light-emitting element LD3, a capping layer TFE and a light control pattern LCP.

Here, the first transistor TR1 may include a first active pattern ACT1, a first gate electrode GE1, a first source electrode SE1 and a first drain electrode DE1. The second transistor TR2 may include a second active pattern ACT2, a second gate electrode GE2, a second source electrode SE2 and a second drain electrode DE2. The third transistor TR3 may include a third active pattern ACT3, a third gate electrode GE3, a third source electrode SE3 and a third drain electrode DE3.

In addition, the first light-emitting element LD1 may include a first pixel electrode PET, a first light-emitting layer EL1 and a common electrode CE. The second light-emitting element LD2 may include a second pixel electrode PE2, a second light-emitting layer EL2 and the common electrode CE. The third light-emitting element LD3 may include a third pixel electrode PE3, a third light-emitting layer EL3 and the common electrode CE.

The substrate SUB may include a transparent material or an opaque material. In an embodiment, the substrate SUB may include a transparent resin substrate. In embodiments, the transparent resin substrate may include a polyimide substrate, or the like. In this case, the substrate SUB may include a first organic layer, a first barrier layer, a second organic layer, or the like. In another embodiment, the substrate SUB may include a quartz substrate, a synthetic quartz substrate, a calcium fluoride substrate, an F-doped quartz substrate, a soda lime glass substrate, a non-alkali glass substrate, or the like. These may be used alone or in any combinations with each other.

The buffer layer BUF may be disposed on the substrate SUB. The buffer layer BUF may prevent diffusion of metal atoms or impurities from the substrate SUB into the first, second and third transistors TR1, TR2 and TR3. In addition, the buffer layer BUF may improve flatness of a surface of the substrate SUB when the surface of the substrate SUB is not uniform. The buffer layer BUF may include an inorganic material such as silicon oxide, silicon nitride, silicon oxynitride, or the like. These may be used alone or in any combinations with each other.

The first, second and third active patterns ACT1, ACT2 and ACT3 may be disposed on the buffer layer BUF. Each of the first, second and third active patterns ACT1, ACT2 and ACT3 may include a source area, a drain area and a channel area disposed between the source area and the drain area. The first, second and third active patterns ACT1, ACT2 and ACT3 may be formed through a same process, and may include a same material as each other.

Each of the first, second and third active patterns ACT1, ACT2 and ACT3 may include a silicon semiconductor material or an oxide semiconductor material. In embodiments, the silicon semiconductor material may include amorphous silicon, polycrystalline silicon, or the like. In embodiments, the oxide semiconductor material may include indium gallium zinc oxide ("IGZO"), indium tin zinc oxide ("ITZO"), or the like. These may be used alone or in any combinations with each other.

The gate insulating layer GI may be disposed on the buffer layer BUF. The gate insulating layer GI may sufficiently cover the first, second and third active patterns ACT1, ACT2 and ACT3, and may include a substantially flat upper surface without generating a step around the first, second and third active patterns ACT1, ACT2 and ACT3. Optionally, the gate insulating layer GI may cover the first, second and third active patterns ACT1, ACT2 and ACT3, and may be disposed along a profile of each of the first, second and third active patterns ACT1, ACT2 and ACT3 to have a uniform thickness. In an embodiment, a thickness of a pattern or layer may be measured along a thickness direction perpendicular to a main plane extension direction of the pattern or the layer. The gate insulating layer GI may include an inorganic material such as silicon oxide ($SiO_x$), silicon nitride ($SiN_x$), silicon carbide ($SiC_x$), silicon oxynitride ($SiO_xN_y$), silicon oxycarbide ($SiO_xC_y$), or the like. These may be used alone or in any combinations with each other.

The first, second and third gate electrodes GE1, GE2 and GE3 may be disposed on the gate insulating layer GI. The first gate electrode GE1 may overlap the channel area of the first active pattern ACT1, the second gate electrode GE2 may overlap the channel area of the second active pattern ACT2, and the third gate electrode GE3 may overlap the channel area of the third active pattern ACT3. The first, second and third gate electrodes GE1, GE2 and GE3 may be formed through a same process, and may include a same material as each other.

Each of the first, second and third gate electrodes GE1, GE2 and GE3 may include a metal, a conductive metal oxide, a metal nitride, or the like. In embodiments, the metal may include silver (Ag), molybdenum (Mo), aluminum (Al), tungsten (W), copper (Cu), nickel (Ni), chromium (Cr), titanium (Ti), tantalum (Ta), platinum (Pt), scandium (Sc), or the like. In embodiments, the conductive metal oxide may include indium tin oxide, indium zinc oxide, or the like. In embodiments, the metal nitride may include aluminum nitride ($AlN_x$), tungsten nitride ($WN_x$), chromium nitride ($CrN_x$), or the like. These may be used alone or in any combinations with each other.

The inter-insulating layer ILD may be disposed on the gate insulating layer GI. The inter-insulating layer ILD may sufficiently cover the first, second and third gate electrodes GE1, GE2 and GE3, and may include a substantially flat upper surface without generating a step around the first, second and third gate electrodes GE1, GE2 and GE3. Optionally, the inter-insulating layer ILD may cover the first, second and third gate electrodes GE1, GE2 and GE3, and may be disposed along a profile of each of the first, second and third gate electrodes GE1, GE2 and GE3 to have a uniform thickness. The inter-insulating layer ILD may include an inorganic material such as silicon oxide, silicon nitride, silicon carbide, silicon oxynitride, silicon oxycarbide, or the like. These may be used alone or in any combinations with each other.

The first, second and third source electrodes SE1, SE2 and SE3 may be disposed on the inter-insulating layer ILD. The first source electrode SE1 may be connected to the source area of the first active pattern ACT1 through a contact hole penetrating the gate insulating layer GI and the inter-insulating layer ILD. The second source electrode SE2 may be connected to the source area of the second active pattern ACT2 through a contact hole penetrating the gate insulating layer GI and the inter-insulating layer ILD. The third source electrode SE3 may be connected to the source area of the third active pattern ACT3 through a contact hole penetrating the gate insulating layer GI and the inter-insulating layer ILD.

The first, second and third drain electrodes DE1, DE2 and DE3 may be disposed on the inter-insulating layer ILD. The first drain electrode DE1 may be connected to the drain area of the first active pattern ACT1 through a contact hole penetrating the gate insulating layer GI and the inter-insulating layer ILD. The second drain electrode DE2 may be connected to the drain area of the second active pattern ACT2 through a contact hole penetrating the gate insulating layer GI and the inter-insulating layer ILD. The third drain electrode DE3 may be connected to the drain area of the third active pattern ACT3 through a contact hole penetrating the gate insulating layer GI and the inter-insulating layer ILD.

The first, second and third source electrodes SE1, SE2 and SE3 and the first, second and third drain electrodes DE1, DE2 and DE3 may be formed through a same process, and may include a same material as each other. Each of the first, second and third source electrodes SE1, SE2 and SE3 and the first, second and third drain electrodes DE1, DE2 and DE3 may include a metal, an alloy, a metal nitride, a conductive metal oxide, a transparent conductive material, or the like. These may be used alone or in any combinations with each other.

Accordingly, the first transistor TR1 including the first active pattern ACT1, the first gate electrode GE1, the first source electrode SE1 and the first drain electrode DE1 may be disposed on the substrate SUB. The second transistor TR2 including the second active pattern ACT2, the second gate electrode GE2, the second source electrode SE2 and the second drain electrode DE2 may be disposed on the substrate SUB. The third transistor TR3 including the third active pattern ACT3, the third gate electrode GE3, the third source electrode SE3 and the third drain electrode DE3 may be disposed on the substrate SUB.

The via-insulating layer VIA may be disposed on the inter-insulating layer ILD. The via-insulating layer VIA may sufficiently cover the first, second and third source electrodes SE1, SE2 and SE3 and the first, second and third drain electrodes DEL, DE2 and DE3. The via-insulating layer VIA may include an organic material such as phenolic resin, polyacrylate resin, polyimide resin, polyamide resin, siloxane resin, epoxy resin, or the like. These may be used alone or in any combinations with each other.

The first, second and third pixel electrodes PE1, PE2 and PE3 may be disposed on the via-insulating layer VIA. The first pixel electrode PE1 may overlap the first light-emitting area LA1, the second pixel electrode PE2 may overlap the second light-emitting area LA2, and the third pixel electrode PE3 may overlap the third light-emitting area LA3. The first pixel electrode PE1 may be connected to the first drain electrode DE1 through a contact hole penetrating the via-insulating layer VIA. The second pixel electrode PE2 may be connected to the second drain electrode DE2 through a contact hole penetrating the via-insulating layer VIA. The third pixel electrode PE3 may be connected to the third drain electrode DE3 through a contact hole penetrating the via-insulating layer VIA.

The first, second and third pixel electrodes PE1, PE2 and PE3 may be formed through a same process, and may include a same material as each other. Each of the first, second and third pixel electrodes PE1, PE2 and PE3 may include a metal, an alloy, a metal nitride, a conductive metal oxide, a transparent conductive material, or the like. These may be used alone or in any combinations with each other. In an embodiment, each of the first, second and third pixel electrodes PE1, PE2 and PE3 may operate as an anode, for example.

The pixel defining layer PDL may be disposed on the via-insulating layer VIA The pixel defining layer PDL may overlap the non-light-emitting area NLA. The pixel defining layer PDL may cover opposite sides of each of the first, second and third pixel electrodes PE1, PE2 and PE3. In addition, an opening exposing a portion of an upper surface of each of the first, second and third pixel electrodes PE1, PE2 and PE3 may be defined in the pixel defining layer PDL. The pixel defining layer PDL may include an organic material or an inorganic material. In an embodiment, the pixel defining layer PDL may include an organic material such as epoxy resin, siloxane resin, or the like, for example. These may be used alone or in any combinations with each other. In another embodiment, the pixel defining layer PDL may further include a light-blocking material including a black pigment, a black dye, or the like, for example.

The first light-emitting layer EL1 may be disposed on the first pixel electrode PET, the second light-emitting layer EL2 may be disposed on the second pixel electrode PE2, and the third light-emitting layer EL3 may be disposed on the third pixel electrode PE3. Each of the first, second and third light-emitting layers EL1, EL2 and EL3 may include an organic material that emits light of a predetermined color. In an embodiment, the first light-emitting layer EL1 may include an organic material that emits red light, the second light-emitting layer EL2 may include an organic material that emits green light, and the third light-emitting layer EL3 may include an organic material that emits blue light, for example. However, the disclosure is not limited thereto.

The common electrode CE may be disposed on the first light-emitting layer EL1, the second light-emitting layer EL2, the third light-emitting layer EL3 and the pixel defining layer PDL. The common electrode CE may be a plate electrode. The common electrode CE may include a metal, an alloy, a metal nitride, a conductive metal oxide, a transparent conductive material, or the like. These may be used alone or in any combinations with each other. In an embodiment, the common electrode CE may operate as a cathode, for example.

Accordingly, the first light-emitting element LD1 including the first pixel electrode PET, the first light-emitting layer EL1 and the common electrode CE may be disposed in the first light-emitting area LA1 on the substrate SUB. The second light-emitting element LD2 including the second pixel electrode PE2, the second light-emitting layer EL2 and the common electrode CE may be disposed in the second light-emitting area LA2 on the substrate SUB. The third light-emitting element LD3 including the third pixel electrode PE3, the third light-emitting layer EL3 and the common electrode CE may be disposed in the third light-emitting area LA3 on the substrate SUB. Each of the first, second and third light-emitting elements LD1, LD2 and LD3 may overlap the opening defined by the pixel defining layer PDL.

The capping layer TFE may be disposed on the common electrode CE. The capping layer TFE may prevent impurities, moisture, air, or the like from permeating the first, second and third light-emitting elements LD1, LD2 and LD3 from an outside. In an embodiment, the capping layer TFE may include at least one inorganic layer and at least one organic layer. In an embodiment, the organic layer and the inorganic layer may be alternately stacked, for example.

The light control pattern LCP may be disposed on the capping layer TFE. The light control pattern LCP may overlap the pixel defining layer PDL. That is, the light control pattern LCP may overlap the non-light-emitting area NLA. In an embodiment, the light control pattern LCP may control light emitted from each of the first, second and third light-emitting elements LD1, LD2 and LD3 to the light control pattern LCP using constructive interference or destructive interference. Accordingly, the light control pattern LCP may be switched between the wide viewing angle mode (e.g., public mode) and a narrow viewing angle mode (e.g., privacy mode). That is, the light control pattern LCP may adjust a viewing angle of the display device 10. In an embodiment, the light control pattern LCP may include an inclined outer side surface OSD.

The light control pattern LCP may include an inclined structure SS, an electrode pattern EP, an insulating layer IL, a reflective layer RL, a semi-transmissive layer PL and support patterns SP.

The inclined structure SS may include an inclined side surface SD. In an embodiment, the inclined structure SS may have a trapezoidal cross-sectional shape, for example, but the disclosure is not limited thereto.

The electrode pattern EP may be disposed on the side surface SD of the inclined structure SS. A voltage may be applied to the electrode pattern EP.

The insulating layer IL may be disposed on the side surface SD of the inclined structure SS. The insulating layer IL may cover opposite sides of the electrode pattern EP.

The reflective layer RL may be disposed on the electrode pattern EP and the insulating layer IL. The reflective layer RL may contact at least a portion of the electrode pattern EP. In an embodiment, the reflective layer RL may be connected to the electrode pattern EP through a contact hole penetrating the insulating layer IL, for example. Accordingly, when the voltage is applied to the electrode pattern EP, the voltage may also be applied to the reflective layer RL. The reflective layer RL may reflect light emitted from each of the first, second and third light-emitting elements LD1, LD2 and LD3 in a desired direction.

The semi-transmissive layer PL may be disposed on the reflective layer RL. The semi-transmissive layer PL may be spaced apart from the reflective layer RL. The semi-transmissive layer PL may cover the inclined structure SS. That is, the semi-transmissive layer PL may extend along a profile of the side surface SD and an upper surface of the inclined structure SS on the reflective layer RL. The semi-transmissive layer PL may transmit some of the light emitted from each of the first, second and third light-emitting elements LD1, LD2 and LD3, and may reflect others of the light emitted from each of the first, second and third light-emitting elements LD1, LD2 and LD3 in a desired direction.

A position of the semi-transmissive layer PL may be variable. Specifically, the position of the semi-transmissive layer PL may be variable according to the voltage applied to the electrode pattern EP. In other words, the voltage applied to the electrode pattern EP may generate an electrostatic force between the reflective layer RL and the semi-transmissive layer PL, and the semi-transmissive layer PL may move toward or away from the reflective layer RL according to the electrostatic force.

The air layer AL may be defined between the reflective layer RL and the semi-transmissive layer PL. That is, the air layer AL may be disposed in a space in which the reflective layer RL and the semi-transmissive layer PL are spaced apart from each other.

A thickness of the air layer AL may be variable. In this case, the thickness of the air layer AL may mean a distance from an upper surface of the reflective layer RL to a lower surface of the semi-transmissive layer PL. Specifically, the thickness of the air layer AL may vary according to the voltage applied to the electrode pattern EP In other words, the thickness of the air layer AL may vary according to the position of the semi-transmissive layer PL. The thickness of the air layer AL may be less than about 1 micrometer ($\mu m$).

In an embodiment, as the thickness of the air layer AL is greater, a wavelength that constructively interferes with the light control pattern LCP may be longer. In addition, as the thickness of the air layer AL is less, the wavelength that constructively interferes with the light control pattern LCP may be shorter. In an embodiment, when the thickness of the air layer AL is relatively great, the light control pattern LCP may constructively interfere with visible light having a relatively long wavelength, for example. In addition, when the thickness of the air layer AL is relatively small, the light control pattern LCP may constructively interfere with ultraviolet light having a relatively short wavelength.

Each of the support patterns SP may be disposed between the capping layer TFE and the semi-transmissive layer PL. Each of the support patterns SP may support the semi-transmissive layer PL to define the air layer AL. That is, each of the support patterns SP may support the semi-transmissive layer PL so that the semi-transmissive layer PL is spaced apart from the reflective layer RL. Specifically, some of the support patterns SP may be disposed on the upper surface of the inclined structure SS to support the semi-transmissive layer PL at an upper part the light control pattern LCP. In addition, others of the support patterns SP may be disposed on an upper surface of the capping layer TFE to support the semi-transmissive layer PL at a lower part of the light control pattern LCP.

In the wide viewing angle mode, a first voltage may be applied to the electrode pattern EP. An intensity of the first voltage may vary according to a wavelength of the light emitted from each of the first, second and third light-emitting elements LD1, LD2 and LD3 to the light control pattern LCP. Accordingly, an electrostatic force may be generated between the reflective layer RL and the semi-transmissive layer PL, and the air layer AL may have a first thickness TH1. In other words, compared to a case in which no voltage is applied to the electrode pattern EP, when the first voltage is applied to the electrode pattern EP, the semi-transmissive layer PL may move closer to the reflective layer RL.

In an embodiment, in the wide viewing angle mode, the light control pattern LCP may constructively interfere with at least a portion of visible light emitted by each of the first, second and third light-emitting elements LD1, LD2 and LD3. That is, the light control pattern LCP may constructively interfere with visible light having a viewing angle greater than or equal to a predetermined angle among the visible light emitted from each of the first, second and third light-emitting elements LD1, LD2 and LD3. Accordingly, the visible light emitted toward the light control pattern LCP from the first, second and third light-emitting elements LD1, LD2 and LD3 may be reflected by the light control pattern LCP, and may be emitted to the first, second and third light-emitting areas LA1, LA2 and LA3, respectively.

In an embodiment, the light control pattern LCP may have bistability. Accordingly, when the voltage is applied to the light control pattern LCP, the thickness of the air layer AL may be maintained even after the applied voltage is removed. Accordingly, loss of power consumption may be reduced.

Figure 7:
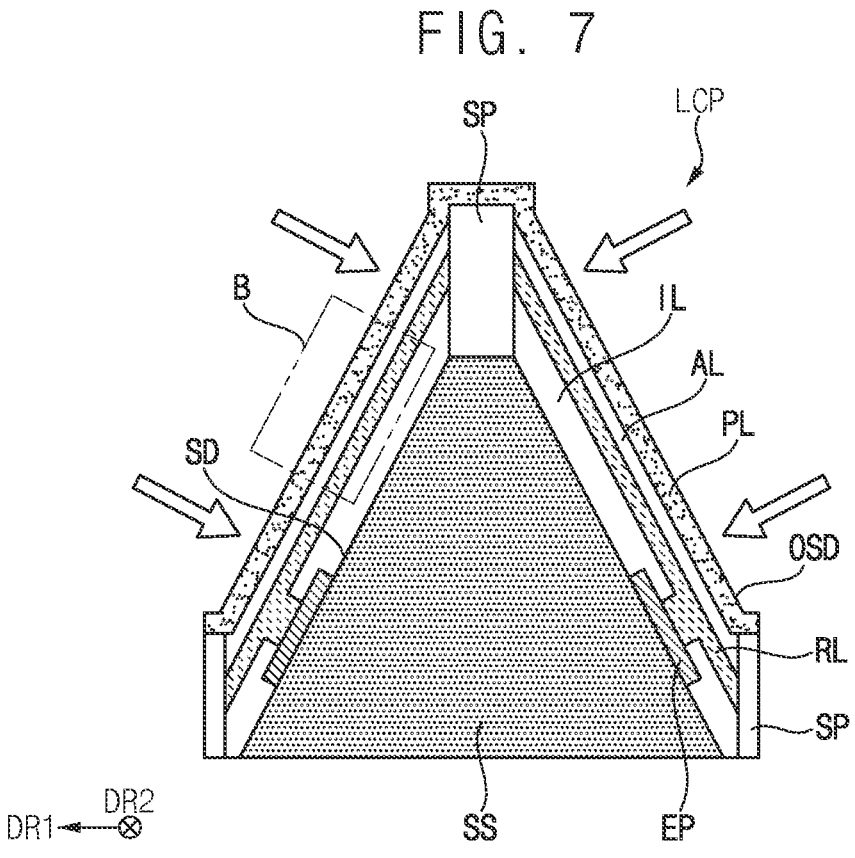
FIG. 7 is an enlarged cross-sectional view of a light control pattern of FIG. 6.
Figure 8:
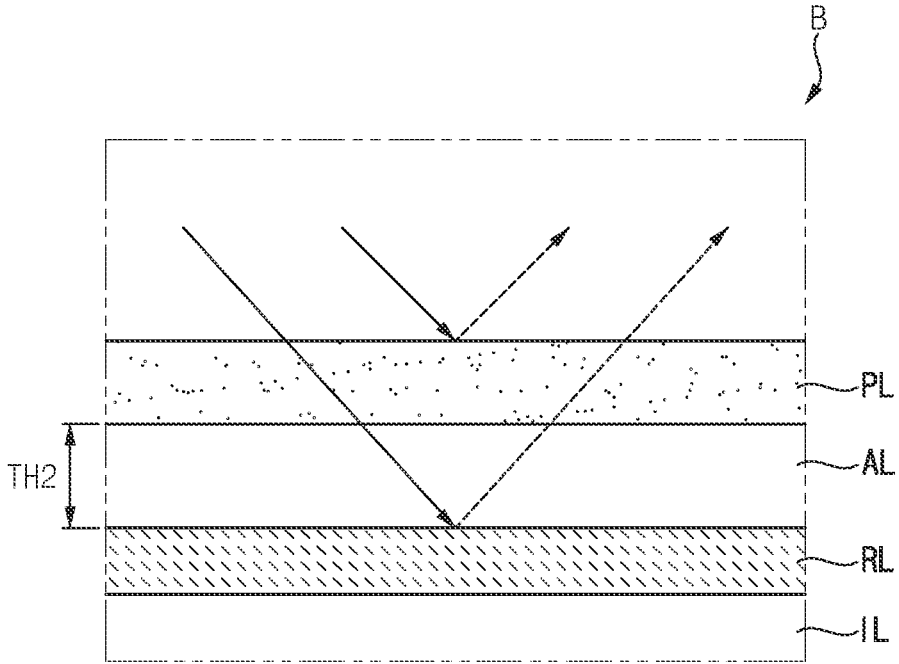
FIG. 8 is an enlarged cross-sectional view of area B of FIG. 7.

FIG. 6 is a cross-sectional view illustrating another embodiment of FIG. 3. FIG. 7 is an enlarged cross-sectional view of a light control pattern of FIG. 6. FIG. 8 is an enlarged cross-sectional view of area B of FIG. 7. In an embodiment, FIGS. 6, 7 and 8 may be cross-sectional views illustrating the narrow viewing angle mode of the light control pattern LCP, and FIG. 8 may be an enlarged cross-sectional view of the air layer AL defined by the light control pattern LCP, for example.

Hereinafter, descriptions overlapping those of the display device 10 described with reference to FIGS. 3, 4 and 5 will be omitted or simplified.

Referring to FIGS. 6, 7 and 8, the display device 10 may include the substrate SUB, the buffer layer BUF, the first transistor TR1, the second transistor TR2, the third transistor TR3, the gate insulating layer GI, the inter-insulating layer ILD, the via-insulating layer VIA, the pixel defining layer PDL, the first light-emitting element LD1, the second light-emitting element LD2, the third light-emitting element LD3, the capping layer TFE and the light control pattern LCP.

In the narrow viewing angle mode, a second voltage may be applied to the electrode pattern EP. An intensity of the second voltage may vary according to the wavelength of the light emitted from each of the first, second and third light-emitting elements LD1, LD2 and LD3 to the light control pattern LCP. The intensity of the second voltage may be different from the intensity of the first voltage. In an embodiment, the intensity of the second voltage may be greater than the intensity of the first voltage, for example. Accordingly, a relatively large electrostatic force may be generated between the reflective layer RL and the semi-transmissive layer PL, and the air layer AL may have a second thickness TH2. The second thickness TH2 may be smaller than the first thickness TH1. In other words, compared to the case in which the first voltage is applied to the electrode pattern EP, when the second voltage is applied to the electrode pattern EP, the semi-transmissive layer PL may move close to the reflective layer RL.

In an embodiment, in the narrow viewing angle mode, the light control pattern LCP may destructively interfere with at least a portion of the visible light emitted by each of the first, second and third light-emitting elements LD1, LD2 and LD3. In addition, in the narrow viewing angle mode, the light control pattern LCP may constructively interfere with at least a portion of ultraviolet light emitted by each of the first, second and third light-emitting elements LD1, LD2 and LD3.

That is, the light control pattern LCP may destructively interfere with the visible light having the viewing angle greater than or equal to the predetermined angle among the visible light emitted from each of the first, second and third light-emitting elements LD1, LD2 and LD3. In addition, the light control pattern LCP may constructively interfere with ultraviolet light having the viewing angle greater than or equal to the predetermined angle among the ultraviolet light emitted from each of the first, second and third light-emitting elements LD1, LD2 and LD3. Accordingly, the visible light emitted toward the light control pattern LCP from the first, second and third light-emitting elements LD1, LD2 and LD3 may be offset by the light control pattern LCP, and may not be emitted to the first, second and third light-emitting areas LA1, LA2 and LA3, respectively. That is, in the narrow viewing angle mode, the viewing angle greater than or equal to the predetermined angle may be blocked.

The display device 10 in an embodiment of the disclosure may include the light control pattern LCP including the reflective layer RL and the semi-transmissive layer PL. The reflective layer RL and the semi-transmissive layer PL may define the air layer AL, and the thickness of the air layer AL may vary according to the voltage applied to the electrode pattern EP. Accordingly, the light control pattern LCP may constructively interfere with the visible light in the wide viewing angle mode, and may destructively interfere with the visible light in the narrow viewing angle mode. That is, in the narrow viewing angle mode, only the visible light having the viewing angle greater than or equal to the predetermined angle among the visible light emitted from each of the light-emitting elements LD1, LD2 and LD3 may be offset, so that luminance of the display device 10 may not be degraded. In addition, since a separate film process is not desired, efficiency of a manufacturing process of the display device 10 may be improved.

Figure 9:
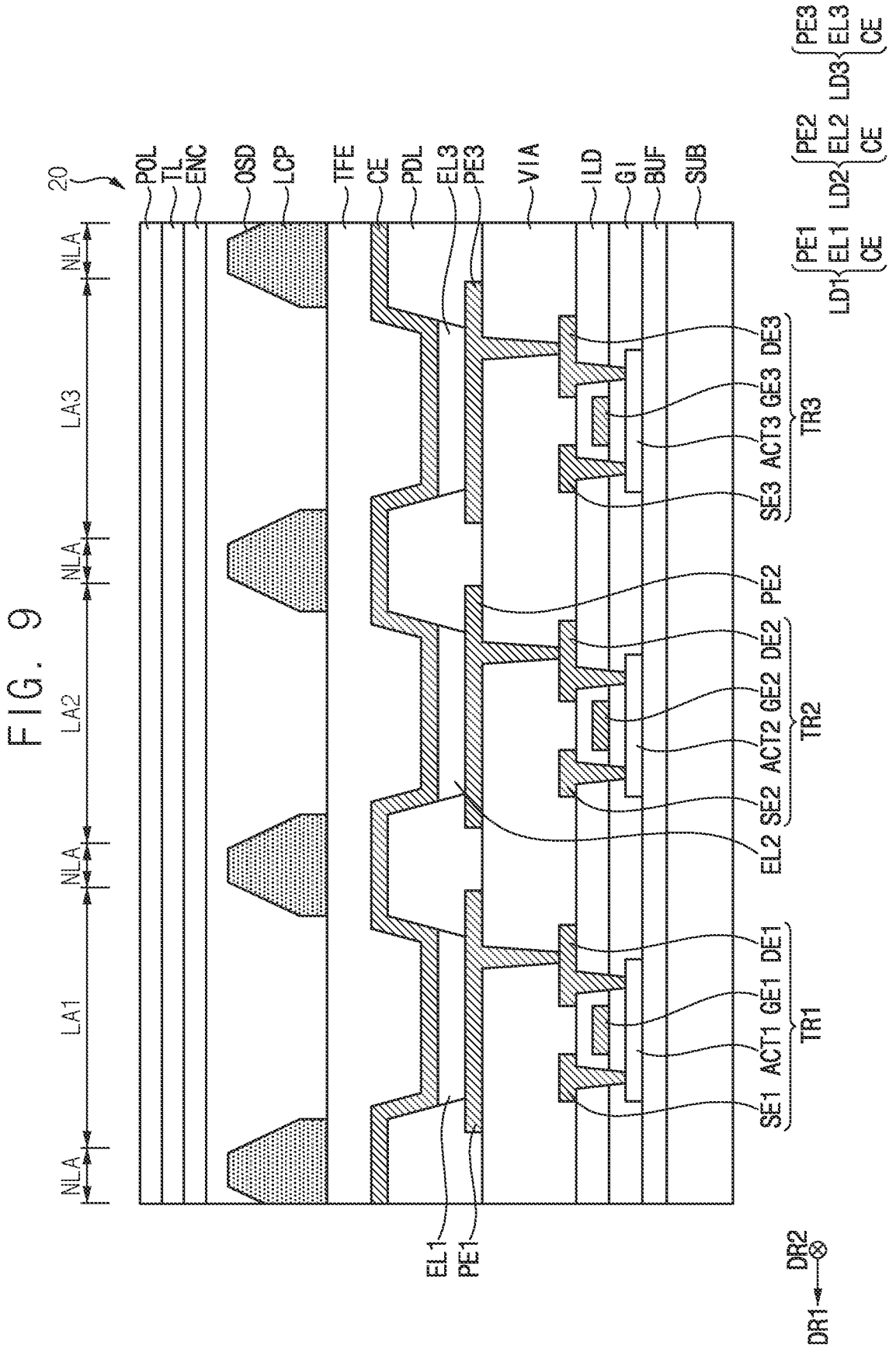
FIG. 9 is a cross-sectional view illustrating another embodiment of a display device according to the disclosure.
Figure 10:
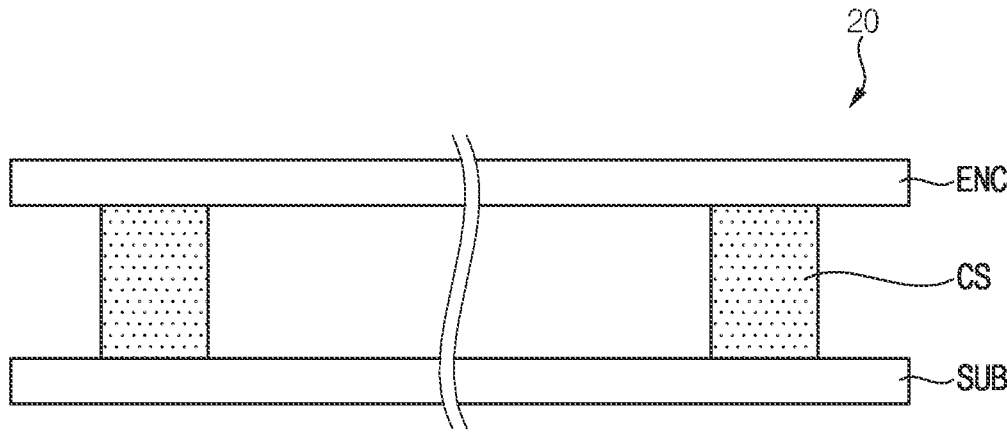
FIG. 10 is a cross-sectional view schematically illustrating the display device of FIG. 9.

FIG. 9 is a cross-sectional view illustrating a display device according to the disclosure. FIG. 10 is a cross-sectional view schematically illustrating the display device of FIG. 9. In an embodiment, FIG. 9 may correspond to the cross-sectional view of FIG. 3, for example.

Hereinafter, descriptions overlapping those of the display device 10 described with reference to FIGS. 1, 2, 3, 4, 5, 6, 7 and 8 will be omitted or simplified.

Referring to FIGS. 9 and 10, a display device 20 may include the substrate SUB, the buffer layer BUF, the first transistor TR1, the second transistor TR2, the third transistor TR3, the gate insulating layer GI, the inter-insulating layer ILD, the via-insulating layer VIA, the pixel defining layer PDL, the first light-emitting element LD1, the second light-emitting element LD2, the third light-emitting element LD3, the capping layer TFE, the light control pattern LCP, an encapsulation substrate ENC, a sealing member CS, a polarization layer POL and a touch sensing layer TL.

The encapsulation substrate ENC may be disposed on the light control pattern LCP. In an embodiment, the encapsulation substrate ENC may include glass. The encapsulation substrate ENC may protect the light control pattern LCP.

The sealing member CS may be disposed between the substrate SUB and the encapsulation substrate ENC. In an embodiment, the sealing member CS may be disposed along an edge of each of the substrate SUB and the encapsulation substrate ENC, for example. The sealing member CS may bond the substrate SUB and the encapsulation substrate ENC, and may prevent external foreign matter from penetrating into inside.

The touch sensing layer TL may be disposed on the encapsulation substrate ENC. The touch sensing layer TL may recognize an external stimulus (e.g., a touch). The touch sensing layer TL may include a plurality of touch electrodes for sensing a user's touch in a capacitive manner.

The polarization layer POL may be disposed on the touch sensing layer TL. The polarization layer POL may include a phase retardation film such as a $\lambda/4$ plate (Quarter-Wave Plate) and a linear polarizer. The phase retardation film and the linear polarizer may be sequentially stacked on the encapsulation substrate ENC. The polarization layer POL may polarize passing light to reduce reflection of external light. In an embodiment, the polarization layer POL may be a polarization film, for example, but the disclosure is not limited thereto.

The display device 20 in another embodiment of the disclosure may include the light control pattern LCP and the encapsulation substrate ENC. The encapsulation substrate ENC may protect the light control pattern LCP from foreign matter penetrating from the outside and external impact. Since the light control pattern LCP may be switched between the wide viewing angle mode and the narrow viewing angle mode, a viewing angle of the display device 20 may be adjusted through the light control pattern LCP without a separate light-blocking film.

The disclosure may be applied to various display devices. In an embodiment, the disclosure is applicable to various display devices such as display devices for vehicles, ships and aircraft, portable communication devices, display devices for exhibition or information transmission, medical display devices, or the like, for example.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims. Therefore, it is to be understood that the foregoing is illustrative of various embodiments and is not to be construed as limited to the illustrative embodiments disclosed, and that modifications to the disclosed embodiments, as well as other embodiments, are intended to be included within the scope of the appended claims.

What is claimed is:

1. A display device comprising:
a substrate;
a light-emitting element disposed on the substrate;
a capping layer disposed on the light-emitting element; and
a light control pattern disposed on the capping layer, including an inclined outer side surface and defining an air layer having a thickness which is variable,
wherein the light control pattern includes:
an inclined structure including an inclined side surface;
an electrode pattern disposed on the inclined side surface of the inclined structure;
a reflective layer disposed on the electrode pattern; and
a semi-transmissive layer disposed on the reflective layer and having a position which is variable.

2. The display device of claim 1, wherein the reflective layer contacts at least a portion of the electrode pattern.

3. The display device of claim 1, wherein the air layer is defined between the reflective layer and the semi-transmissive layer.

4. The display device of claim 1, wherein the thickness of the air layer varies according to a voltage applied to the electrode pattern.

5. The display device of claim 1, wherein the thickness of the air layer varies according to the position of the semi-transmissive layer.

6. The display device of claim 1, wherein the light control pattern further includes:
an insulating layer disposed between the inclined structure and the reflective layer and covering at least a portion of the electrode pattern.

7. The display device of claim 1, wherein the light control pattern further includes:
a support pattern disposed between the capping layer and the semi-transmissive layer and supporting the semi-transmissive layer.

8. The display device of claim 1, wherein the semi-transmissive layer covers the inclined structure.

9. The display device of claim 1, further comprising:
an encapsulation substrate disposed on the light control pattern.

10. The display device of claim 9, wherein the encapsulation substrate includes glass.

11. The display device of claim 9, further comprising:
a sealing member disposed between the substrate and the encapsulation substrate.

12. The display device of claim 1, wherein the light control pattern is switched between a wide viewing angle mode and a narrow viewing angle mode.

13. The display device of claim 12, wherein in the narrow viewing angle mode, the light control pattern destructively interferes with at least a portion of visible light emitted by the light-emitting element.

14. The display device of claim 12, wherein
in the wide viewing angle mode, the electrode pattern is applied with a first voltage and the air layer has a first thickness, and
in the narrow viewing angle mode, the electrode pattern is applied with a second voltage and the air layer has a second thickness different from the first thickness.

15. The display device of claim 14, wherein the first thickness is greater than the second thickness.

16. The display device of claim 12, wherein in the wide viewing angle mode, the light control pattern constructively interferes with at least a portion of visible light emitted by the light-emitting element.

17. The display device of claim 16, wherein in the narrow viewing angle mode, the light control pattern constructively interferes with at least a portion of ultraviolet light emitted by the light-emitting element.

18. A display device, comprising:
a substrate;
a light-emitting element disposed on the substrate;
a capping layer disposed on the light-emitting element;
a light control pattern disposed on the capping layer, including an inclined outer side surface and defining an air layer having a thickness which is variable; and
a pixel defining layer disposed on the substrate,
wherein the pixel defining layer defines an opening overlapping the light-emitting element.

19. The display device of claim 18, wherein the light control pattern overlaps the pixel defining layer.

* * * * *